United States Patent [19]

Maeda et al.

[11] 4,320,529
[45] Mar. 16, 1982

[54] FREQUENCY COUNTING APPARATUS

[75] Inventors: Hidetoshi Maeda; Kazuo Inoue, both of Kashiwara; Noboru Someno, Tokyo, all of Japan

[73] Assignees: Sharp Kabushiki Kaisha, Osaka; Sony Corp., Tokyo, both of Japan

[21] Appl. No.: 24,027

[22] Filed: Mar. 26, 1979

[30] Foreign Application Priority Data

Apr. 3, 1978 [JP] Japan ................................ 53/39621

[51] Int. Cl.³ ........................................... G01R 23/02
[52] U.S. Cl. ............................. 455/158; 235/92 TF; 235/92 DP; 235/92 T; 368/10
[58] Field of Search ......... 235/92 FQ, 92 TF, 92 DP, 235/92 DM, 92 T, 92 PL, 92 DE; 364/484; 324/78 D; 455/158; 368/10

[56] References Cited

U.S. PATENT DOCUMENTS

| | | | |
|---|---|---|---|
| 2,851,596 | 9/1958 | Hilton | 235/92 TF |
| 3,158,854 | 11/1964 | Keen et al. | 235/92 TF |
| 3,681,707 | 8/1972 | Bean | 235/92 TF |
| 4,027,146 | 5/1977 | Gilmore | 235/92 FQ |
| 4,107,600 | 8/1978 | McMannis | 324/78 D |
| 4,163,943 | 8/1979 | Miki et al. | 324/78 D |

*Primary Examiner*—Joseph M. Thesz

[57] ABSTRACT

A frequency counting apparatus is advantageously utilized as a frequency counter for displaying in a digital manner the frequency being received by a radio receiver. The inventive frequency counting apparatus includes a quartz resonator adapted to oscillate at the frequency of $2^n$ Hz where n is a positive integer, for example 32,768 Hz, and a microprocessor including a programming unit, an operating unit for making operation in accordance with a program of the programming apparatus, a counter and a control unit. The program steps of the programming unit are made to progress based on the oscillation output signal of the quartz resonator. The counter is supplied with a local oscillation signal of a radio receiver. The local oscillation signal supplied to the counter is gated for a predetermined time period determined in accordance with the program of the programming unit, whereby the local oscillation signal is counted. The count value in the counter is multiplied or divided by a prescribed correction factor preloaded in the programming unit by means of the operating unit.

13 Claims, 7 Drawing Figures

FREQUENCY COUNTING APPARATUS

BACKGROUND OF THE INVENTION

1. Field of the Invention

The present invention relates to a frequency counting apparatus. More specifically, the present invention relates to a frequency counting apparatus that can be used for displaying in a digital manner the frequency being received by a radio receiver, for example.

2. Description of the Prior Art

A typical conventional display for the frequency being received or the tuning frequency by a radio receiver is a so-called dial type display wherein a pointer is slidable on a frequency graduation chart in accordance with the tuning frequency. However, the recent development of integrated circuit technology provided a digital display for displaying in a digital manner the frequency being received or the tuning frequency of a radio receiver. Such a digital frequency display usually comprises a frequency counter for counting the frequency being received or a local oscillation frequency, and a display for displaying the tuning frequency responsive to the count value in the frequency counter. As is well known, it is required that the frequency counter be controlled such that the count time period is changed or controlled in accordance with the frequency bands of the signal being applied.

On the other hand, a radio receiver in combination with an electronic clock has been proposed and put in practical use. When an electronic clock having a digital display is used in such an electronic clock combined radio receiver, such an electronic clock usually comprises a quartz resonator having a resonance frequency of 32,768 Hz commensurate with $2^{15}$, a microprocessor adapted to control a timing operation which is responsive to a clock signal obtained from the quartz resonator, and a digital display for displaying horological information obtained by the timing operation.

SUMMARY OF THE INVENTION

The present invention comprises a central processing unit operable which is responsive to instructions obtained from a programming unit and adapted such that the program steps progress in accordance with a system clock. A gate means is provided for gating an input signal being applied to a frequency counter; said gate means is controlled on or off in accordance with a signal obtained from the central processing unit and thus in accordance with the instructions obtained from the programming unit.

In a preferred embodiment of the present invention, the above described system clock is generated from an oscillation signal obtained from a quartz resonator having a resonance frequency of $2^n$ where n is a positive integer, for example 32,768 Hz, the most widely employed base frequency for an electronic clock. A timing scheme is adapted to make a timing operation responsive to a second signal having a frequency of 1 Hz and a digital display is adapted to display in a digital manner the horological information thus obtained. A switching means is provided for selecting a horological information display mode or a frequency information display mode for the digital display. The central processing unit is responsive to the switching means, thereby to selectively perform either a timing operation or a frequency counting operation.

Therefore, a principal object of the present invention is to provide a novel frequency counting apparatus controllable by a microprocessor.

Another object of the present invention is to provide a novel frequency counting apparatus, wherein an input signal being applied to a frequency counter is gated in response to instructions obtained from a programming unit for providing instructions to a microprocessor.

A further object of the present invention is to provide a frequency counter that is capable of accurately counting a frequency being received by a radio receiver.

Still a further object of the present invention is to provide a frequency counting apparatus that is capable of counting the frequency with high accuracy, in any of the frequency bands, by the use of a quartz resonator for a clock.

These objects and other objects and features, aspects and advantages of the present invention will become more apparent from the following detailed description of the present invention when taken in conjunction with the accompanying drawings.

DESCRIPTION OF THE PREFERRED EMBODIMENT

Figure 1:
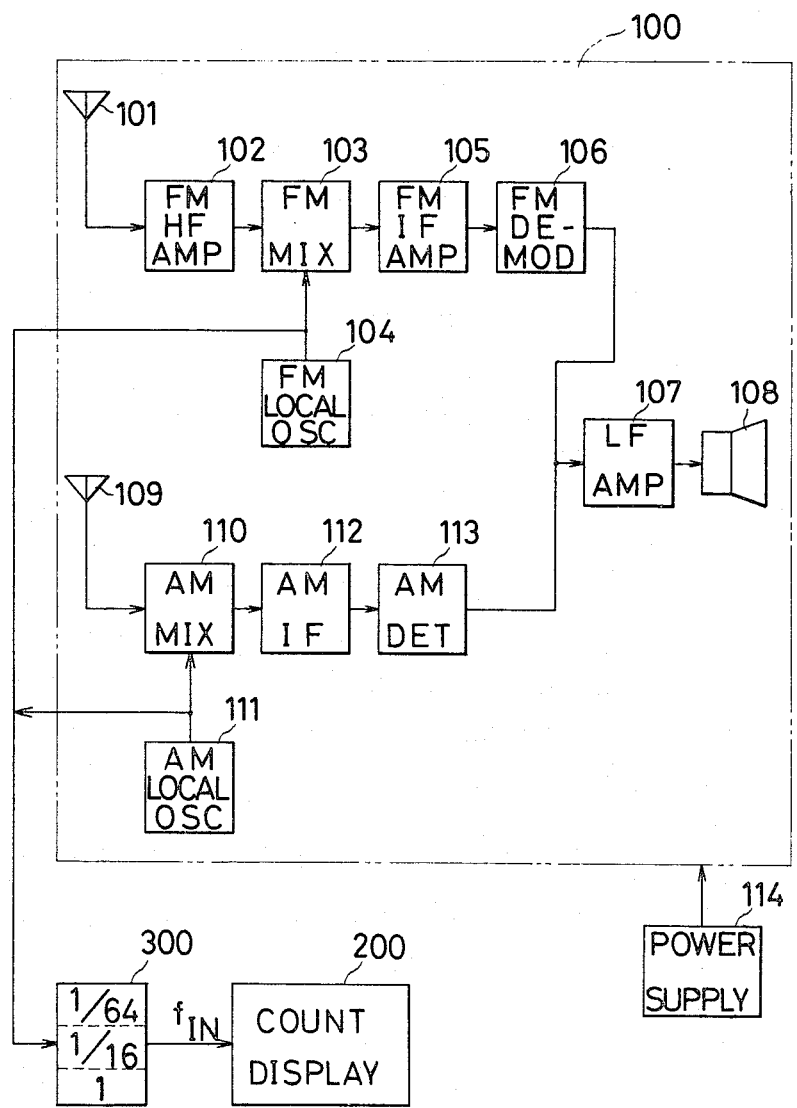
FIG. 1 is a block diagram showing one embodiment of an electronic clock combined radio receiver employing the present invention, wherein a radio receiver portion 100 is shown in more detail.

FIG. 1 shows a block diagram of one embodiment of an electronic clock combined with a radio receiver employing the present invention. Referring to FIG. 1, it is pointed out that a radio receiver portion 100 is shown in detail, while a major portion of the present invention is shown in a simplified manner. However, since the circuit configuration of such a radio receiver 100 is well known to those skilled in the art, the radio receiver portion 100 will be described rather briefly in the following discussion. The radio receiver 100 of the embodiment shown comprises an FM band portion and an AM band portion including a medium wave band and a short wave band. The components for the FM band portion are denoted by the reference numerals 101 to 106, while the components for the AM band portion are denoted by the reference numerals 109 to 113.

At the outset the FM band portion will be considered. A signal received by an FM antenna 101 is amplified by a high frequency amplifier 102 and is applied to an FM mixer 103. The FM mixer 103 is also supplied with a local oscillation signal obtained from an FM local oscillator 104. Assuming that the frequency being received in the FM ban is 76 to 90 MHz, then the local oscillator 104 is adapted to generate a local oscillation signal of a frequency which is 10.7 MHz than the frequency being received. Accordingly, the mixer 103 provides an intermediate frequency signal of 10.7 MHz frequency. The intermediate frequency signal of the frequency 10.7 HMz is applied to an intermediate frequency amplifier 105. The output of the intermediate frequency amplifier 105 is applied to a frequency detector or demodulator 106 so that the intermediate frequency ouput is frequency demodulated.

Now the AM band portion will be considered. A signal received by an AM antenna 109 is applied to an AM mixer 110. The AM mixer 110 is also supplied with a local oscillation signal obtained from an AM local oscillator 111. The AM local oscillator 111 is structured to generate the AM local oscillation signal having a frequency 455 KHz higher than the frequency being received. Accordingly, the AM mixer 112 provides an intermediate frequency signal of a 455 KHz frequency. The AM intermediate frequency signal is amplified by the AM intermediate frequency amplifier 112 and the amplified AM intermediate frequency signal is detected by an AM detector 113. It is pointed out that although usually the local oscillator 111 is implemented with separate local oscillators for the SW band and the MW band, respectively, the embodiment shown in FIG. 1 is shown as comprising a single local oscillator 111 only for ease of illustration.

Both the output of the FM demodulator 106 and the output of the AM detector 113 are applied to a low frequency amplifier 107. The detected output is thus amplified by the low frequency amplifier 107 and the output of the low frequency amplifier 107 is applied to a speaker 108 to drive the same. It is further pointed out that such radio receiver 100 further comprises a power supply 114 for energization thereof.

The local oscillation signal is selectively obtained from the FM band local oscillator 104 or the AM band local oscillator 111 of the radio receiver 100 and is applied through a prescaler 300 including a frequency divider to a count display circuit 200. The prescaler 300 comprises a frequency divider having a frequency division rate of, for example, 1/256 in case of the FM band, so that the output signal of the local oscillator 104 having the frequency of 65.3 to 79.3 MHz is frequency divided by the frequency division rate of 1/256 to provide an input frequency signal $f_{IN}$, which is applied to the count display circuit 200. As described previously, the AM band includes the SW band and the MW band. In case of the SW band, the output signal from the local oscillator 111 is frequency divided at the frequency division rate of 1/64 to provide an input frequency signal $f_{IN}$. On the other hand, in case of the MW band, the local oscillation signal from the local oscillator 111 having a frequency of 1015 to 2055 KHz is directly applied as an input frequency signal $f_{IN}$ to the count display circuit 200.

Figure 2:
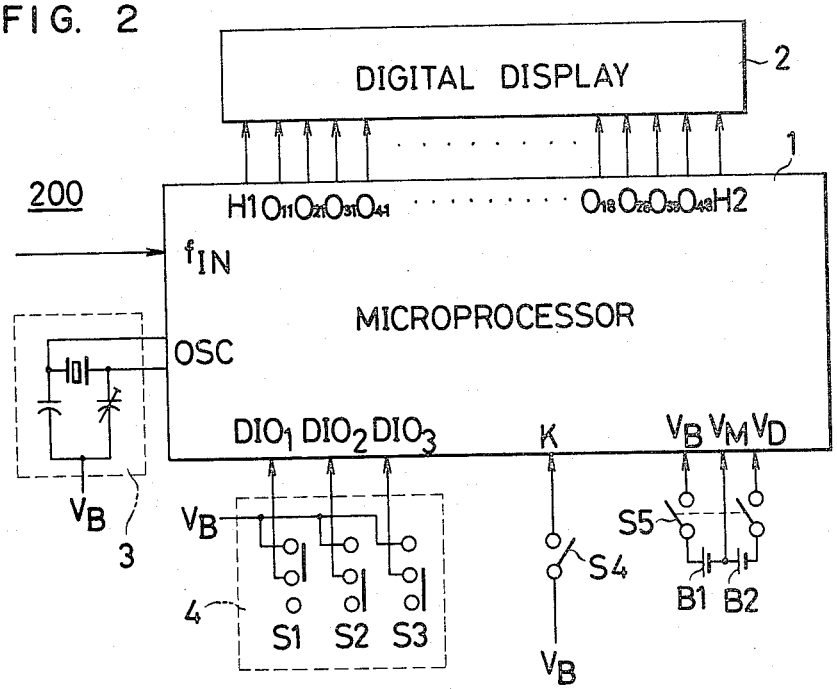
FIG. 2 is a block diagram showing the count display circuit 200 shown in FIG. 1.

FIG. 2 is a block diagram showing the count display circuit 200 shown in FIG. 1. The count display circuit 200 basically comprises a microprocessor 1, a digital display 2 of a liquid crystal type, for example, and a quartz resonator circuit 3. The microprocessor 1 is connected to receive an input frequency signal $f_{IN}$ obtained from the prescaler 300, as described previously. The microprocessor 1 is also connected to receive the oscillation signal obtained from the quartz resonator circuit 3. Since the radio receiver 1 is implemented as an electronic clock combined with a receiver or a radio receiver in combination with an electronic clock, the quartz resonator circuit 3 is structured to generate a clock signal having a resonance frequency of 32,768 Hz which is the frequency typically employed for the generation of a time reference signal for such an electronic clock. The microprocessor 1 is also connected to receive band selection signals $DIO_1$ $DIO_2$ $DIO_3$ from a band selection switch circuit 4. The band selection switch circuit 4 comprises a switch S1 corresponding to the FM band, a switch S2 corresponding to the SW band, and a switch S3 corresponding to the MW band. The switches S1, S2 and S3 are implemented as a switch of a one-selectable type wherein selection of one of the switches S1, S2 and S3 automatically turns the remaining switches off. For example, if and when the switch S1 corresponding to the FM band is turned on, as shown in FIG. 2, then the remaining two switches S2 and S3 are turned off, as shown in FIG. 2. Accordingly, only the signal of $DIO_1$ from the switch S1 assumes a high level, while the remaining two signals $DIO_2$ and $DIO_3$ both assume a low level. The microprocessor 1 is adapted to identify a frequency band being received in response to a logical state pattern of the signals $DIO_1$, $DIO_2$ and $DIO_3$. A switch S4 is aimed to select a display operation mode of the display 2, such that closing of the switch S4 selects a display of tuning frequency information by the radio receiver while opening of the switch S4, as shown in FIG. 2, selects a display of current horological information by means of the display 2. The power supplies B1 and B2 are those those for supplying voltages $V_B$, $V_M$ and $V_D$ to the microprocessor 1 and are controlled by closing or opening of a power supply switch S5. It is pointed that various switches used only for the purpose of controlling a horological function are well known to those skilled in the art and hence are omitted for simplicity of illustration and depiction. Such a horological scheme is disclosed in detail in U.S. Pat. No. 4,063,409, issued Dec. 20, 1977 to John A. Bayliss and entitled "CUSTOM WATCH".

Figure 3:
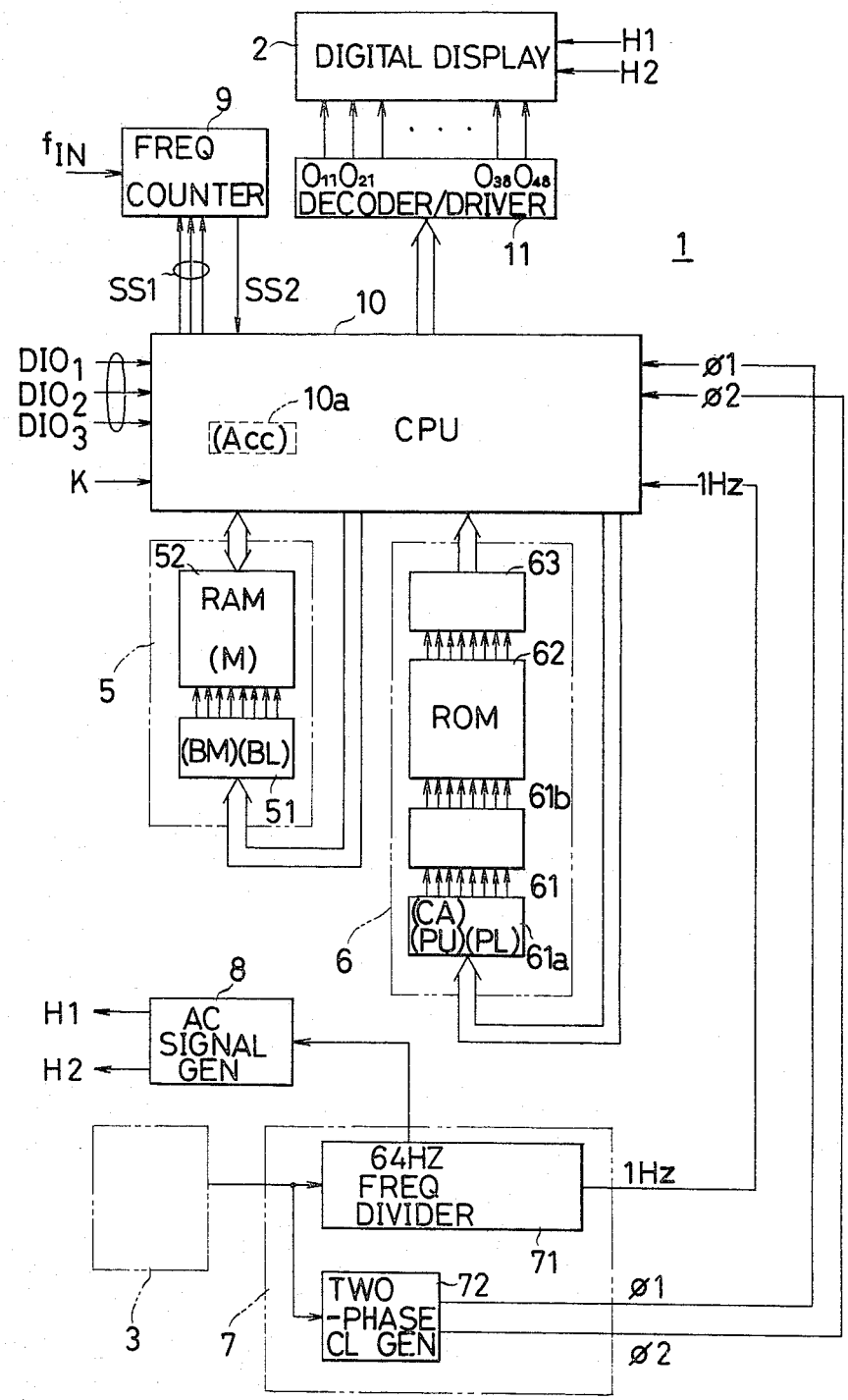
FIG. 3 is a block diagram showing in more detail the microprocessor 1 shown in FIG. 2.

FIG. 3 is a block diagram showing in detail the microprocessor 1 shown in FIG. 2. The microprocessor 1 comprises a central processing unit 10, a read only memory device 6 serving as a programming unit for providing instructions to the processing unit 10, and a random access memory device 5 serving as an operation register. The processing unit 10 comprises an accumulator 10a for an arithmetic operation. The random access memory device 5 comprises a random access memory addressing circuit 51 and a random access memory 52. The random access memory device 5 is structured to be responsive to the addressing information obtained from the central processing unit 10 to write in data in the corresponding address of the random access memory 52 or read out data from the corresponding address of the random access memory 52. The random access memory 52 comprises operation registers X, Y and Z. The read only memory device 6 comprises a read only memory addressing circuit 61 including an address counter 61a and an address decoder 61b, a read only memory 62 and an instruction decoder 63. The program steps of the read only memory device 6 and thus the count value in the read only memory address counter 61a is stepped reponse to a clock signal related the signal from the quartz resonator circuit 3, as to be more fully described subsequently.

The oscillation output signal obtained from the quartz resonator circuit 3 is applied to a clock signal frequency dividing circuit 7. The clock signal frequency dividing circuit 7 comprises a frequency divider 71 and a two-phase clock generator 72. The frequency divider 71 comprises a cascade connection of fifteen divide by two frequency dividers or binary counters and the output of the final stage frequency divider is a signal having the frequency of one-hertz. The one hertz signal is applied to the central processing unit 10 for the purpose of clocking the timing operation. A signal having a frequency of 64 Hz is obtained from the midway of the cascade connection and is applied to an alternating current signal generator 8. The two-phase clock generator 72 is structured to generate clock signals $\phi 1$ and $\phi 2$ having a frequency of one half of the 32,768 Hz frequency of the oscillation output signal obtained from the quartz resonator circuit 3. It is pointed out that the clock signals $\phi 1$ and $\phi 2$ are out of phase, so as to be described subsequently. The central processing unit 10 is connected to receive the above described clock signals $\phi 1$ and $\phi 2$ as a system clock. The read only memory device 6 advances of the program steps in synchronism with the above described clock signal $\phi 2$. Such operation of one-clock/one-instruction has been achieved by a microprocessor chip model SM-4 manufactured and sold by Sharp Kabushiki Kaisha the assignee of the present invention. The liquid crystal display 2 is a display of the so-called $\frac{1}{2}$ duty and $\frac{1}{2}$ bias display driver type and, to that end, alternating signals H1 and H2 are generated by the alternating signal generator 8. Such a liquid crystal display of the so-called $\frac{1}{2}$ duty and $\frac{1}{2}$ bias display driver type as well as an alternating signal generator for that purpose are well known to those skilled in the art and it is not believed necessary to describe the same in more detail.

The microprocessor 1 further comprises a frequency counter 9 for counting the frequency. The frequency counter 9 is aimed to count the frequency of the input frequency signal $f_{IN}$ obtained from the gate circuit, not shown in FIG. 3. The output of the counter 9 is applied to the central processing unit 10 as a signal SS2. The counter 9 is controlled in response to a control signal SS1 obtained from the central processing unit 10. The frequency counter 9 as well as the control signal SS1 will be described in more detail subsequently with reference to FIG. 4. The central processing unit 10 receives the signal SS2 from the frequency counter 9, the signals $DIO_1$, $DIO_2$ and $DIO_3$ from the switch circuit 4 and the signal K from the switch S4 and provides to a decoder/driver 11 the data concerning a frequency being displayed. The decoder/driver 11 is responsive to the data being applied to provide segment drive signals $O_{11}$, $O_{21}$, ... $O_{38}$, $O_{48}$. Such segment drive signals $O_{11}$ to $O_{48}$ are well known to those skilled in the art in the above described $\frac{1}{2}$ duty and $\frac{1}{2}$ bias display driver type. Although not shown, the display 2 is also aimed to display the current horological information to provide a clock function and selection of the time information display mode and the frequency information display mode is achieved by the signal K obtained from the switch S4 as described previously.

Figure 4:
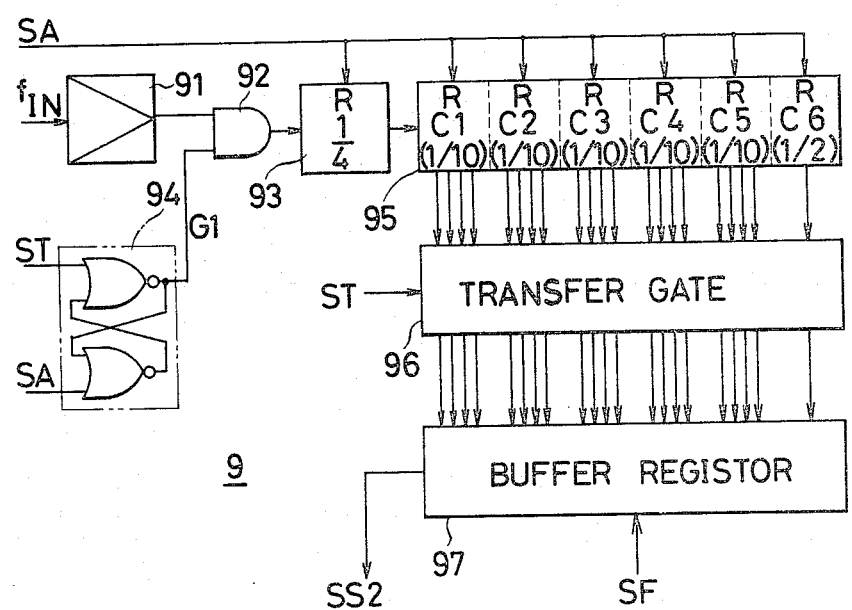
FIG. 4 is a block diagram showing in more detail the frequency counter 9 shown in FIG. 3.

FIG. 4 is a block diagram showing in more detail the counter 9 shown in FIG. 3. The counter 9 comprises an amplifier 91 connected to receive the input frequency signal $f_{IN}$. The input frequency signal $f_{IN}$ as amplified by the amplifier 91 is applied to an AND gate 92 as one input thereto. The other input of the AND gate 92 is connected to receive a non-inverted output (G1) obtained from a flip-flop 94 which is adapted to be set responsive to an instruction signal SA and to be reset responsive to an instruction signal ST. Accordingly, the AND gate 92 is opened or enabled if and when the non-inverted output of the flip-flop 94 is the high level, so that the input frequency signal $f_{IN}$ is applied therethrough to a $\frac{1}{4}$ frequency divider 93. The output of the $\frac{1}{4}$ frequency divider 93 is applied to a counter 95 comprising five binary coded decimal counters C1 to C5 and a binary counter C6. The count value in the counter 95 is applied through a transfer gate 96 to a buffer register 97. The buffer register 97 is implemented as a parallel-in/serial-out register. As seen from the description as to an instruction set to be made subsequently, the instruction signal SA is a count initiate instruction signal and the flip-flop 94 is set responsive to the instruction signal SA while the $\frac{1}{4}$ frequency divider 93 and the counter 95 are reset responsive to the instruction signal SA. As further seen from a description as to an instruction set to be made subsequently, the instruction signal ST is a count terminate instruction signal and the flip-flop 94 is reset responsive to the instruction signal ST and the transfer gate 96 is opened responsive to the instruction signal ST. An instruction signal SF is a shift instruction signal for the buffer register 97 and the buffer register 97 makes a shift operation when the instruction signal SF is received and provides a serial output signal SS2 to the central processing unit 10. These instruction signals SA, ST and SF constitutes the signal SS1 shown in FIG. 3 and these instruction signals are programmed in advance in the programming unit or the read only memory device 6. Such a program will be described in more detail subsequently.

Figure 5:
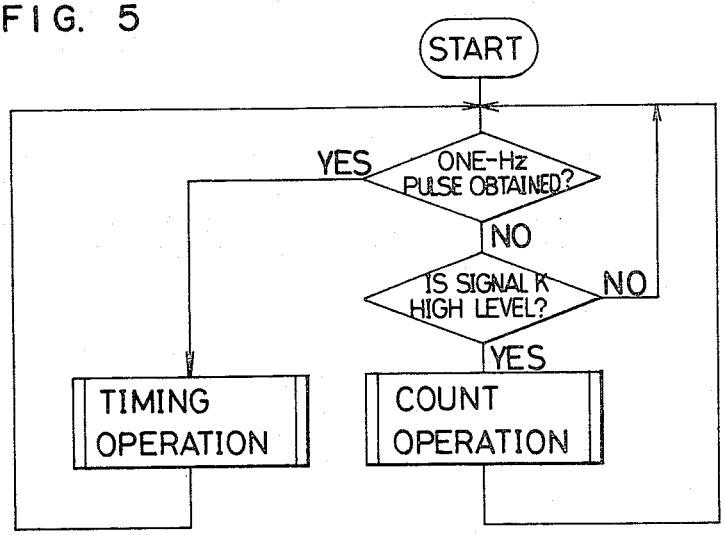
FIG. 5 is a flow diagram showing an outline of the operation of one embodiment of the present invention.

FIG. 5 is a flow diagram for explaining the fundamental operation of the embodiment shown in FIGS. 1 to 4. For example, closing of the power supply switch S5 energizes or enables the microprocessor 1. The central processing unit 10 (FIG. 3) of the microprocessor 1 then determines whether a one second pulse, i.e. a one-hertz signal, is available from the frequency dividing circuit 7. If and when the one-second pulse, i.e. one-hertz signal, is obtained, then a timing operation routine is initiated. If and when no one-second pulse is obtained, then a decision is made as to whether the signal K obtained from the switch S4 is a high level. If and when the signal K is a high level, then the frequency display operation mode has been selected and therefore a frequency count routine is initiated. If and when the signal K is a low level, then decision is regained whether one-second pulse is obtained. Since such a timing operation routine is described in detail in the above referenced U.S. Pat. No. 4,063,409, a further description thereof is omitted. Thus, whichever routine is initiated, the timing operation routine or the frequency count routine, the choice of routine is determined by the signal K, i.e. the state of the switch S4. It is pointed out that this is one feature of the present invention.

Figure 6:
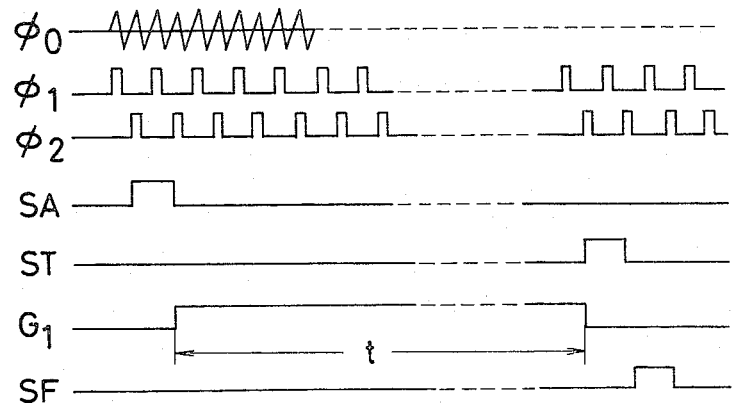
FIG. 6 is a timing chart for explaining the operation of the counter 9 of the embodiment shown.

FIG. 6 is a time chart for explaining the operation of the counter 9 shown in FIGS. 3 and 4. Referring to FIG. 6, the reference character $\phi 0$ denotes an oscillation signal of the quartz resonator 3 and the frequency thereof have been selected to be $2^{15} = 32,768$ Hz. The reference characters $\phi 1$ and $\phi 2$ denote the clock signals generated by the two-phase clock generator 20 in response to the oscillation signal $\phi 0$ and the frequency thereof is 16,384 Hz which is one half of the frequency of the original oscillation signal $\phi 0$. The signals SA, ST and SF are provided by the read only memory device 6, as described previously. These signals SA, ST and SF will be described in detail subsequently. If and when the instruction signal SA is obtained from the programming unit or the read only memory device 6, the flip-flop 94 is set and the non-inverted output becomes a high level.

Accordingly, the AND gate 92 is thereafter opened and the input frequency signal $f_{IN}$, as amplified by the amplifier 91, is in succession applied to the ¼ frequency divider 93 and the counter 95. Accordingly, the counter 95 counts the input frequency signal $f_{IN}$ as frequency divided at the frequency division rate ¼. When the instruction signal ST is obtained from the programming unit or the read only memory device 6 after the lapse of t seconds, the flip-flop 94 is reset, whereby the non-inverted output becomes a low level. Accordingly, the AND gate 92 is closed or disabled and thereafter the input frequency signal $f_{IN}$ is not applied to the subsequent counter 95 any more. Thus, it follows that the counter 95 counts the input frequency signal $f_{IN}$ for the above described time period of t seconds. Following the above described instruction signal ST, the instruction signal SF is obtained from the programming unit or the read only memory device 6, whereby the buffer register 97 performs a shift operation so that the data in the counter 95, as loaded through the transfer gate 96 is obtained as an output signal SS2 and is applied to the central processing unit 10.

Assuming that, as shown in FIG. 4, the input signal $f_{IN}$ (KHz) obtained through the ¼ frequency divider 93 is applied to the counter 95 and the gate time period of the AND gate 92 is t msec, then the count value Cn of the counter 95 may be expressed by the following equation:

$$Cn' = (t/4) \times f_{IN} \quad (1)$$

Accordingly, as far as the MW band of the AM band is concerned, on the assumption that the gate time period t is 4 msec, then the count value Cn may be expressed by the following equation:

$$Cn = f_{IN} \quad (2)$$

In the above described instance, the count value directly represents the input frequency (KHz), which is most advantageous.

In case of the SW band of the AM band, the local oscillation signal from the local oscillator 11 is frequency divided by the prescaler 300 at the frequency division rate of 1/16, as described previously with reference to FIG. 1, and therefore the count value in the counter 95 may be expressed by the following equation:

$$Cn = \frac{t}{16 \times 4} \times f_{IN} \quad (2')$$

Accordingly, assuming that the gate time period t is selected to be 64 msec for the SW band, then the count value in the counter 95 directly represents the frequency of the input frequency signal $f_{IN}$.

On the other hand, in case of the FM band, the local oscillation signal from the local oscillator 104 is frequency divided by the prescaler at the frequency division rate 1/64. Therefore, the count value in the counter 95 in case of the FM band may be expressed by the following equation:

$$Cn = \frac{t}{64 \times 4} \times f_{IN} \quad (2'')$$

Accordingly, in case of the FM band, assuming that the gate time period t is selected to be 256 msec, then the count value in the counter 95 directly represents the frequency of the input frequency signal $f_{IN}$.

However, as described previously, in the embodiment shown, the system clock is generated based on the original oscillation signal obtained from the quartz resonator circuit 3 prepared for an electronic clock and therefore one instruction time period, i.e. one bit time is 1/16384 sec. Accordingly, in order to achieve the gate time periods of 4 msec, 64 msec and 256 msec for the MW, SW and FM bands, respectively, by controlling the number of program steps P, then the number of program steps P becomes as follows:

$$P = t \times \frac{1}{16384} \quad (3)$$

Accordingly, in case of the MW band, the number of program steps becomes 65.536, in case of the SW band the number of program steps P becomes 1,048.576, and in case of the FM band, the number of program steps becomes 4,194.304. As seen from the foregoing description, in any case of the frequency bands, the number of program steps does not become an integer value. Therefore, in the embodiment shown, the integer values closest to the above described numbers of the program steps P are employed as the number of program steps P for each of the frequency bands. For example, the number of program steps P=66 was employed for the MW band, the number of program steps =1,050 was employed for the SW band and the number of program steps=4195 was employed for the FM band, in the embodiment in discussion. The switching selection of such numbers of program steps is performed by changing the program routines in association with the frequency band as identified by the central processing unit 10.

Figure 7:
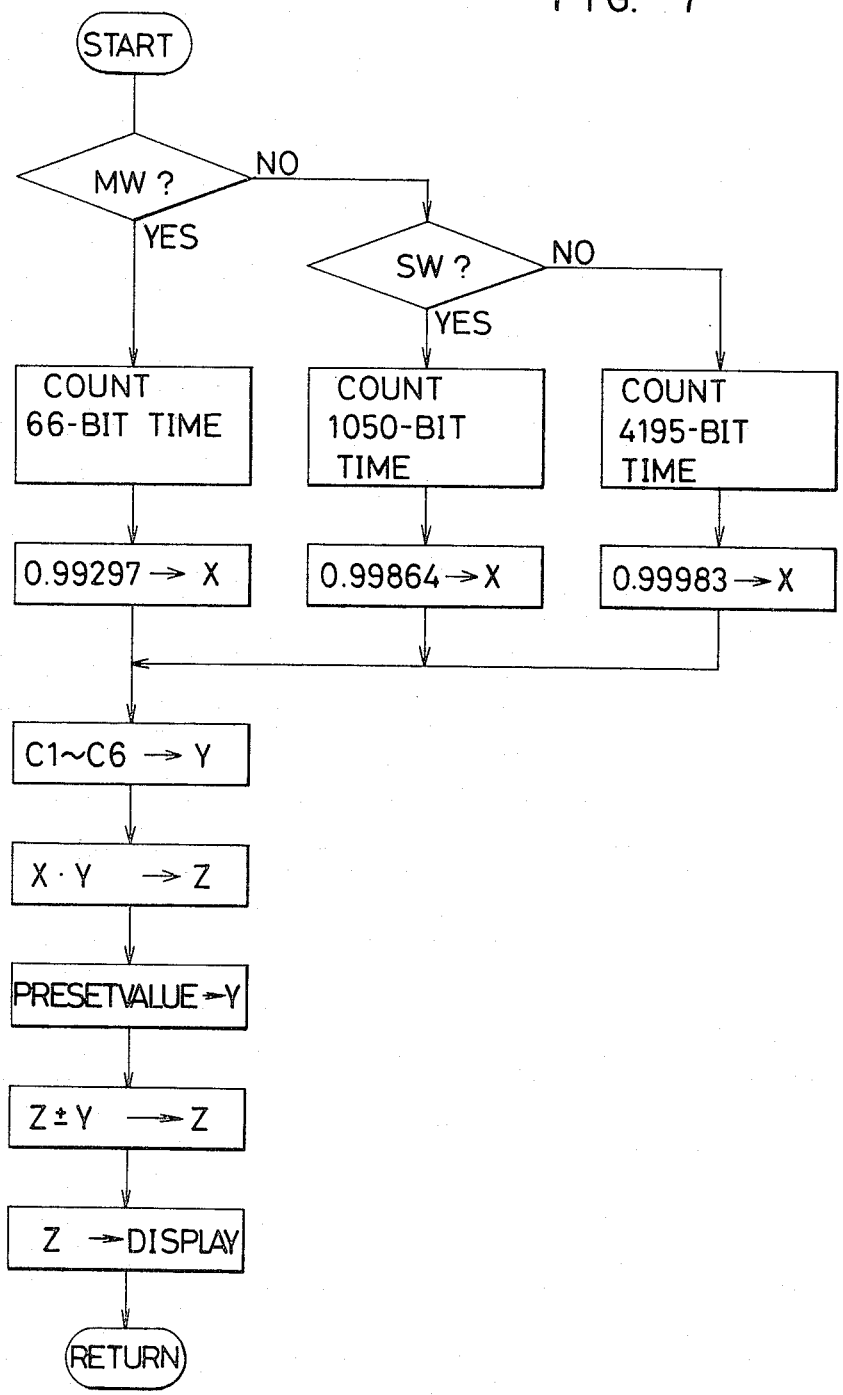
FIG. 7 is a flow diagram for explaining the frequency counting operation of the embodiment shown.

FIG. 7 is a flow diagram showing a count display routine in the flow diagram shown in FIG. 5. Referring to FIG. 2, assuming that only the switch SW3 is turned on while the remaining two switches S1 and S2 are turned off in the switch circuit 4, then this situation means that the frequency band being received is the MW band. On the occasion of reception of the MW band, it would be appreciated that from the above described convention the number of program steps P=66 and thus a count operation should be made for 66 bit times. Although this will be described in more detail subsequently with reference to a specific program, the above described time period of 66 bits is achieved by selecting a time period from the count initiate instruction signal SA to the count terminate instruction signal ST as preloaded in the programming unit to be a time period of 66 bits. On the other hand, referring again to FIG. 2, when the switch S2 is turned on while the remaining switches S1 and S2 are turned off in the switch circuit 4, then this means that the frequency band being received is the SW band and in such a situation the number of program steps P=1050 and hence a count operation should be made for a time period of 1050 bits. The counting operation of the period of 1050 bits is also similarly controlled by the instructing signals SA and ST. More specifically, on the occasion of reception of the SW band, a program is in advance loaded such that a time period of 1050 bits is required after the instruction signal SA is obtained until the instruction signal ST is obtained. This will be also described in more detail subsequently with reference to a specific program. Referring again to FIG. 2, if and when the switch S1 is turned on while the remaining switches S2 and S3 are turned off in the switch circuit 4, the frequency band being received is the FM band and in such situation the counter 9 should be controlled to count a time period of Now the mnemonic representations and the contents thereof of several ones among the fundamental instruction set of the above described program will be briefly described in the following with reference to Table 1.

TABLE 1

| MNEMONIC | CODE | | | | | | | | MICROINSTRUCTION |
|---|---|---|---|---|---|---|---|---|---|
| LBLx,y | 0 | 1 | 0 | 1 | 1 | 1 | 1 | 1 | $I_8 \sim I_5$ $BM_4 \sim BM_1$ $I_4 \sim I_1$ $BL_4 \sim BL_1$ |
|  | $I_8$ | $I_7$ | $I_6$ | $I_5$ | $I_4$ | $I_3$ | $I_2$ | $I_1$ | All the addresses in the random access memory (M) are identified by a two-byte instruction. |
| ADD11 | 0 | 0 | 0 | 0 | 1 | 0 | 0 | 1 | Acc + M + C → Acc $C_4$ → C if$C_4$ = 1;skip The content in the accumulator (Acc) and the content in M and the output of the carry flip-flop (CF/F) are subjected to binary addition, whereupon the result is loaded in Acc and CF/F. If a carry is obtained, the next instruction is skipped. |
| EXC | 0 | 0 | 0 | 1 | 0 | 0 | $I_2$ | $I_1$ | Acc ⟷ M $BM_{2,1} \oplus I_{2,1} \to BM_{2,1}$ The content in Acc and the content in M are exchanged and an exclusive logical sum (BM ⊕ y) of the random access memory address ($BM_{2,1}$) and the content in the valuable y($I_2$, $I_1$) is loaded in $BM_{2,1}$. |
| $EXC_i$ | 0 | 0 | 0 | 1 | 0 | 1 | $I_2$ | $I_1$ | Acc ⟷ M, $BM_{2,1} \oplus I_{2,1} \to BM_{2,1}$, BL + 1 → BL ifBL = a;skip The content in Acc and the content in M are exchanged, $BM_{2,1}$ is replaced by BM ⊕ y and at the same time the random access memory address (BL) is counted up. If and when BL = a, the next instruction is skipped. |
| LAX | 0 | 0 | 1 | 0 | $I_4$ | $I_3$ | $I_2$ | $I_1$ | $I_4 \sim I_1 \to$ Acc x($I_4 \sim I_1$) is loaded in Acc. When LAX is successively obtained, only the first LAX instruction is effective while the further successive LAX instructions are neglected. |
| ADX | 0 | 0 | 1 | 1 | $I_4$ | $I_3$ | $I_2$ | $I_1$ | $I_{4,3,2,1}$ + Acc → Acc if$C_4$ = 1;skip x($I_4 I_1$) is added to Acc and the sum is entered in Acc. When a carry is obtained, the next instruction is skipped. |
| SC | 0 | 1 | 1 | 0 | 0 | 1 | 1 | 1 | 1 → C CF/F is set |
| TAM | 0 | 1 | 0 | 1 | 0 | 0 | 1 | 1 | ifAcc = M;skip When Acc = M, the next instruction is skipped. |
| SSR | 0 | 1 | 1 | 1 | $I_4$ | $I_3$ | $I_2$ | $I_1$ | $I_4 \sim I_1 \to$ SU 1 → E $I_4 I_1$ is loaded in the read only memory address ($SU_4 \sim SU_1$) and E is set. |
| TRO | 1 | 0 | $I_6$ | $I_5$ | $I_4$ | $I_3$ | $I_2$ | $I_1$ | R = 0; $I_6 \sim I_1 \to PI_6 \sim PL_1$, SU → PU, CB → CA R = 1; $I_6 \sim I_1 \to PL_6 \sim PL_1$ $I_6 \sim I_1$ is loaded in the polinomial counter ($PL_6 \sim PL_1$). When R = 0, the content in SU is loaded in PU and the content in CB is loaded in one bit register (CA). |
| SA | 0 | 1 | 1 | 0 | 1 | 0 | 0 | 1 | Reset the counter and start a count operation. |
| ST | 0 | 1 | 1 | 0 | 0 | 0 | 0 | 0 | Count stop, counter → $\phi_{F/F}$ terminate a count operation and transfer the content in the counter to the buffer register. |
| SF | 0 | 1 | 1 | 0 | 1 | 0 | 1 | 1 | LSD → $A_4 \to A_3 \to A_2 \to A_1$ The content in the buffer register to Acc. |

4,195 bits inasmuch as the number of program steps P is 4,195 as described previously. Such a count operation of a time period of 4,195 bits is also described in more detail subsequently with reference to a specific program; however, this is achieved by such a program that a time period of 4,195 bits is required after the instruction signal SA is obtained until the instruction signal ST is obtained.

Specific programs for performing a count operation of the time period of 66 bits, a count operation of the time period of 1050 bits and a count operation of the time period of 4195 bits in accordance with the flow diagram shown in FIG. 7 by the use of the above described instruction set will be described in the following.

Table 2 shows a program for performing a count operation of the number of program steps P=66 in case of the MW band.

TABLE 2

```
        LAX, 0
        SA
    ┌──►ADX, 1  ▲    ▲
    │          │32   │
    │          ▼     │
    └───TRO          │64
    ┌──►ADX, 1  ▲    │
    │          │32   │
    │          ▼     ▼
    └───TRO.
     ┌──TRO
     │
     ►TRO
     │
     └►ST
```

Thus a program for a count operation of P=66 can be established. In case of the MW band, a count operation of the time period of 66 bits can be performed by the frequency counter 9 by selecting the program shown in Table 2 by the central processing unit 10 and sequentially reading out the data from the programming unit or the read only memory device 6. More specifically, in accordance with the instruction signals ADX1 and TRO following the count initiate instruction signal SA, "1" is added to the accumulator 10a (Acc) and the result is entered again in the accumulator 10a. This operation is repeated sixteen times and the same is further repeated sixteen times in accordance with the same instruction signals following the above described repeated operation. As a result, the program steps of 66 bits in total, including 32-bit time+32-bit time=64-bit from the count intiate instruction signal SA, and two bits of two instruction signals TRO immediately before the count terminate instruction signal ST, are stepped. Accordingly, the AND gate 92 included in the counter 9 is opened for a time period of 66 bits and the signal $f_{IN}$ obtained from the MW band local oscillator 111 is applied through the AND gate 92 and the ¼ frequency divider 94 to the counter 95. Accordingly, the counter 95 continues a count operation for the time period of 66 program steps.

Table 3 shows a specific program for performing a count operation of the time period of P=1050 bits in case of the SW band.

TABLE 3

```
        2───►DD
        LAX, 0
        SA
    ┌──►ADX, 1    ▲
    │             │
    │             │
    └───TRO       │64
    ┌──►ADX, 1    │
    │             │
    │             ▼
    └───TRO
```

TABLE 3-continued

```
    ┌──TRO         65
    │
    ►TRO           66      repeat
    │                      thirteen times
    ►TRO           67
    │
    └─►LBL x,y     68
                   69
        SC         70
        ADD 11     71
    ┌──TRO         72
    ├──TRO         73
    │
    └─►EXC, 0      73
        LAX, 0     74
    └───TRO        75
    │
    ►TRO           1049
    │
    ►TRO           1050
    │
    └►ST
```

Thus, a program for a count operation of the time period of 1050 bits for the SW band is established. On the occasion of reception of the SW band, the count operation of the time period of 1050 bits is performed by the frequency counter 9 in the central processing unit 10 by reading out the above described program from the read only memory device 6. More specifically, the program steps as shown by the dotted line in Table 3 are repeated thirteen times after the count initiate instruction signal SA is obtained and then proceed through two instruction signals TRO immediately before the count terminate instruction signal ST from the instruction signal TRO immediately before the instruction signals EXC0 at the fourteenth time. Accordingly, the AND gate 92 is opened for the time period of 1050 program steps in total (=75 steps×14) and a count operation is performed by the counter 95 for that time period. Thus the count operation of the time period of 1050 bits is performed.

Table 4 shows a specific program for performing a count operation of the time period of 4,195 bits in case of the FM band.

TABLE 4

```
        0 ──►DD
        0 ──►EE
        LAX, 0
        SA
    ┌──►ADX, 1     ▲
    │              │
    └───TRO        │48
    ┌──►ADX, 2     │
    │              ▼
    └───TRO
```

TABLE 4-continued

```
         LBL x,y            49
                            50
         SC                 51
         ADD 11             52
       ┌─TRO                53
       │ ┌─TRO              54
       │ │ └─►EXC, 0        54
       │ │   LAX, 0         55
       │ │ ┌─TRO            56
       │ │ │ ►TRO           57
       │ │ │ ►TRO           58
       │ │ │ ►TRO           59
       │ │ │ ►TRO           60
       │ │ │ ►TRO           61
       │ │ │ ►TRO           62
       │ │ │ ►TRO           63
       │ └─►TRO             64
       │   EXCi, 0          55
       │   LAX, 0           56
       │   SC               57
       │   ADD 11           58
       │   EXC, 0           59
       │   LAX 4            60
       │   TAM              61
       │ ┌─TRO EE ≠ 4                62
       │ │ ┌─TRO EE = 4              63
       │ │ │ ►TRO                    64    (4096)
       │ │ │ ►SSR                          (4097)
4098 ──┤ │ ├─TRO                           (4098)
       │ │ └─►LAX, 0        63
       └─────TRO            64
             ►LAX, 0                       (4099)

┌─►ADX, 1     ▲
       └─TRO         │
       ┌─►ADX, 1     │  96
       └─TRO         │
       ┌─►ADX, 1     ▼
       └─TRO
         ST
```

Referring to Table 4, a count operation of the time period of 4,195 bits is performed for the FM band by establishing the program shown in table 4. More specifically, referring to Table 4, the loop shown by the dotted line is circulated fifteen times and then the loop shown by the one dotted line is initiated at the sixteenth time and is repeated four times. In the course of execution of the fourth repetition of the one dotted line loop, the execution is jumped responsive to the instruction signal TRO midway of the fourth repetition of the one dotted line loop at the 4098th bit from the count initiate instruction signal SA to the step LAX0 which is the 4,099th bit, whereupon more 96 steps are added through the same repetition of execution as done in case of the MW band shown in Table 2 described previously. Accordingly, 4195 bits (=64×16×4+2+1+96) are gained. Thus, on the occasion of reception of the FM band by reading the program shown in Table 4 from the read only memory device 6 by the central processing unit 10, the AND gate 92 is opened for the time period of 4,195 bits and a count operation is performed by the counter 95 for that time period. As a result, a count operation of the time period of 4,195 bits is performed for the FM band.

Thus, it would be appreciated that according to the present invention the time period of the count operation by the frequency counter 9 and thus the gate time period t of the AND gate 92 is controlled by the program established in advance in the read only memory device 6.

Since the embodiment shown the number of program steps P actually employed for each of the MW, SW and FM bands was approximated to the number of program steps obtained by calculation, it is necessary to correct an error caused based on such a difference between the actual number of program steps for each band and the number of program steps obtained by calculation. Therefore, according to the embodiment shown, skillful use is made of a multiplying function by the microprocessor 1 to evaluate a product of the count value in the counter 9 multiplied by a correction factor α, so that the product thus obtained is displayed by the display 2. More specifically, in case of the MW band, although the number of program steps P was calculated as 65.536, the number of program steps 66 was employed in the foregoing description for simplicity of execution of the count operation. In order to correct the difference between the number of program steps of 65.536 obtained by calculation and the number of program steps of 66 actually employed, a correction factor α of 0.99297 is determined. As a result, the ultimate count value Cn when the correction factor α of 0.99297 is employed in a count operation by the counter in case of the MW band is calculated as follows:

$$Cn = \alpha \cdot P \times 10^3 \times \frac{1}{16384} \times \frac{1}{4} \times f_{IN} \qquad (4)$$
$$= 0.99297 \times 66 \times 16384 \times \frac{1000}{4} \times f_{IN}$$
$$= 0.99297 \times 1.00708 \times f_{IN}$$
$$= 1.00000022760 \times f_{IN}$$

As seen from the above described equation, correction of the count value can be achieved which can be said to be complete from the standpoint of practical use.

In case of the SW band, although the calculated number of program steps is 1,048.576, the number of program steps of 1,050 was employed in the foregoing description. Therefore, in order to correct the difference therebetween, a correction factor α of 0.99864 is employed. Similarly, in case of the FM band, the calculated number of program steps is 4,194.304, whereas the number of program steps of 4,195 was employed in the foregoing description. In order to rectify the difference, therefore, a correction factor α of 0.99983 is employed in case of the FM band. A correcting operation is performed in the manner as shown in FIG. 7 by using correction factors thus determined.

Referring again to FIG. 7, a count operation of the 66-bit time period, the 1050-bit time period and the 4,195-bit time period is performed in the MW, SW and FM bands, respectively, as described previously. In case of the MW band, the correction factor α=0.99297 as in advance stored in a prescribed region of the random access memory device 5 is loaded in the X register of the random access memory 52. Then the count value of the 66-bit time period as loaded in the accumulator (Acc) 10a responsive to the instruction signal SF described previously is loaded in the Y register of the read only memory 52. Thereafter a multiplying operation is performed with respect to the content in the X register and the content in the Y register, whereupon the product of the multiplying operation is loaded in the Z register of the random access memory 52. The central processing unit 10 is adapted such that the preset value preloaded in the predetermined addresses of the random access memory 52 is loaded in the Y register. The preset value is aimed to evaluate the tuning frequency based on the local oscillation frequency and has been determined as 10.7 MHz for the FM band and 455 KHz for the AM band, these being the intermediate frequencies. The central processing unit 10 is further adapted such that the content in the Y register i.e. the preset value is added to or subtracted from the product thus evaluated, i.e. the local oscillation frequency stored in the Z register. In general, addition is made in case of the FM band and subtraction is made in case of the AM band. The result of the addition or subtraction is loaded in the Z register. The central processing unit 10 is further adapted such that the content in the Z register at that time is applied to the display 2 as display data. Such correcting operation is performed in case of the SW band using the correction factor $\alpha$ of 0.99864. Similarly, such correcting operation is performed in the FM band using the correction factor $\alpha$ of 0.99983.

In the embodiment discussed in the foregoing, correction was made by using the correction factor $\alpha$; however, if and when the number of digits in the display is small and hence the above described difference between the calculated and actually employed numbers of the program steps is negligible, then the above described correcting function is not necessarily required and hence can be dispensed with. In the foregoing description, the actual gate time period t and thus the number of program steps actually employed was selected to be slightly longer than the calculated value and the numerical value close to the unity but slightly smaller than the unity was selected as a correction factor $\alpha$, because such selection of the correction factor $\alpha$ is more preferred as compared with a reversed case. More specifically, assuming that the gate time period t and thus the number of program steps is selected to be shorter than the calculated value, for example the number of program steps t=65 in case of the MW band, and a numerical value close to the unity but larger than the unity is selected as a correction factor $\alpha$, then due to the fact that the correction factor $\alpha$ is larger than the unity no continuous change occurs at the less significant digit positions in the result of calculation but rather a flying change could occur in the numerical value in the result of calculation. Accordingly, in such situation, the number of effective digits in the result of calculation should be decreased and is not preferred. For the above described reason, preferably the number of program steps is selected to be larger than the calculated value and a numerical value close to the unity but slightly smaller than the unity is selected as a correction factor $\alpha$, as described in the foregoing. By employing such approach, the number of effective digits in the result of calculation is increased and an error in display is decreased. This is particularly important in case where the display 2 is used to selectively display the time information and the frequency information. It is further pointed out that the number of program steps as actually employed and the correction factor $\alpha$ for correcting the difference caused thereby may be properly changed from the numerical values as described as an example in the foregoing, insofar as the above described approach of the correction factor $\alpha$ being smaller than the unity is met.

In the above described embodiment, the counter 95 of the frequency counter 9 was preceded by the $\frac{1}{4}$ frequency divider 94; however, any suitable frequency divider may be provided which is determined in consideration of the frequency division rate of the prescaler 300 and the maximum operation frequency of the counter 95. Accordingly, the frequency divider could be dispensed with, depending on the situation. Alternatively, the frequency divider may be selectively interposed in association with the frequency bands being received.

Although in the foregoing the inventive frequency counter was described as embodied for the purpose of displaying a tuning frequency by an electronic clock combined with a radio receiver, it is pointed out that such type of frequency counter can be advantageously utilized in various fields of application. It is further pointed out that although in the foregoing description the invention was described as embodied in an electronic clock combined with a radio receiver and hence a system clock for execution of the program steps was obtained by using the oscillation signal of a frequency of 32,768 Hz generated by a quartz resonator typically used for a electronic clock, any oscillation signal of any frequency may be used for a purpose of the present invention, if the present invention is embodied in equipment not combined with an electronic clock. Conversely, if a quartz resonator circuit having a resonance frequency of $2^n$ Hz such as a frequency of 32,768 Hz is utilized even in equipment not combined with an electronic clock or having no clock function, then a quartz resonator circuit for an electronic clock presently mass produced and favorably available can be used with a lower production cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for counting the frequency of an input frequency signal, comprising:
    reference oscillator means for oscillating at a frequency of $2^n$ Hz, where n is a positive integer,
    system clock generating means operatively connected and responsive to said reference oscillator means for generating a system clock,
    microprocessor means, operatively connected and responsive to said system clock generating means, said microprocessor means comprising programming means defining instructions in program steps and responsive to said system clock, wherein said system clock causes said program steps to advance, said microprocessor further comprising a central processing unit operatively connected to said programming means and counter means and responsive to said instructions in said program steps, and
    gate means operatively connected and responsive to said instructions from said programming means for being controlled for a time period determined by said central processing unit, said gate means gating said input frequency signal, said counter means in said microprocessor means counting in response to said input frequency signal gated by said gating means, and said central processing unit being responsive to said instructions from said programming means in said microprocessor means for performing an arithmetic operation comprising the multiplication of the count value in said counter by a predetermined correction factor.

2. An apparatus for counting the frequency of an input frequency signal in accordance with claim 1, wherein said programming means defines a count initiate instruction and a count terminate instruction, the time interval therebetween defines the number of program steps associated with said time period determined by said central processing unit, and said gate means gated on in response to said count initiate instruction and gated off in response to said count terminate instruction.

3. An apparatus for counting the frequency of an input frequency signal in accordance with claim 2, wherein said correction factor is preloaded in said programming means and said correction factor related to the difference between the calculated number of program steps for said desired time period and the actual number of program steps determined by said central processing unit.

4. An apparatus for counting the frequency of an input frequency signal in accordance with claim 3, wherein said actual number of program steps is selected to be almost equal to but greater than said calculated number of program steps, and said correction factor is selected to be almost equal to but smaller than one.

5. A tuning frequency display apparatus of an electronic clock/radio receiver combination comprising a high frequency signal receiving means for receiving a high frequency signal, a local oscillator means for oscillating at a frequency different from the frequency of said high frequency signal by a predetermined frequency difference, and a mixer means operatively connected to said receiving means and said oscillator means for mixing said high frequency signal received by said high frequency receiving means and said local oscillation signal from said local oscillator means and for providing an intermediate frequency signal, and an electronic clock means including a horological reference oscillator means for generating a horological reference oscillation signal for said electronic clock means at a frequency of $2^n$ Hz, where n is a positive integer, said tuning frequency display comprising:

means operatively connected to said horological reference oscillator means and responsive to said horological reference oscillation signal for generating a system clock, microprocessor means operatively connected to said system clock generating means and responsive to said system clock, said microprocessor means comprising: programming means for defining instructions in program steps and responsive to said system clock for causing said program steps to advance, a central processing unit operatively connected to said programming means and responsive to said instructions in said program steps obtained from said programming means and counter means, and a gate means operatively connected to said programming means and responsive to said instructions from said programming means for gating said local oscillation signal from said local oscillator means, a counter means operatively connected to said gate means for counting the frequency of said local oscillation signal gated by said gate means, and a display means operatively connected to said counter means for displaying a numerical value corresponding to said count value in said count means, wherein said central processing unit is responsive to said instructions from said programming means in said microprocessor means for performing an arithmetic operation on said count value in said counter utilizing a predetermined correction factor.

6. A tuning frequency display apparatus of an electronic clock/radio receiver in accordance with claim 5, wherein said programming means defines a count initiate instruction and a count terminate instruction, the time interval therebetween defining the number of program steps associated with said time period predetermined by said central processing unit, and said gate means gated on in response to said count initiate instruction and gated off in response to said count terminate instruction.

7. A tuning frequency display apparatus of an electronic clock/radio receiver in accordance with claim 6, wherein said correction factor is preloaded in said programming means and said correction factor related to the difference between the calculated number of program steps for said desired time period and the actual number of program steps determined by said central processing unit.

8. A tuning frequency display apparatus of an electronic clock/radio receiver in accordance with claim 7, wherein said actual number of program steps is selected to be almost equal to but greater than said calculated number of program steps, and said correction factor is selected to be almost equal to but smaller than one.

9. A tuning frequency display apparatus of an electronic clock/radio receiver in accordance with claim 5, further comprising:

display mode selecting means operatively connected to said display means for selecting between a horological information display mode and a tuning frequency information mode by said display means, and means operatively connected to and responsive to said display mode selecting means for selectively transferring either said horological information or tuning frequency information corresponding to said count value in said count means to said display means.

10. A tuning frequency display apparatus of an electronic clock/radio receiver in accordance with claim 5, further comprising means for selecting one of a plurality of frequency bands being received.

11. A tuning frequency display apparatus of an electronic clock/radio receiver in accordance with claim 10, wherein said programming means defines a plurality of different program sets, each set corresponding to one of said plurality of frequency bands being received, and each program set defining instructions in program steps, said programming means operatively connected to and responsive to said frequency band selecting means for selectively reading the program set corresponding to the selected frequency band being received.

12. A tuning frequency display apparatus of an electronic clock/radio receiver in accordance with claim 11, wherein each of the program sets in said programming means is defined such that the number of program steps between said count initiate instruction and said count terminate instruction is selected whereby said time period is selected in accordance with the frequency band being received.

13. A tuning frequency display apparatus of an electronic clock/radio receiver in accordance with claim 12, further comprising frequency divider means selectively interposed between said local oscillator means and said gate means and having a predetermined frequency division rate in accordance with the frequency bands being received.

* * * * *

UNITED STATES PATENT AND TRADEMARK OFFICE
CERTIFICATE OF CORRECTION

PATENT NO. : 4,320,529

DATED : March 16, 1982

INVENTOR(S) : Maeda et al.

It is certified that error appears in the above—identified patent and that said Letters Patent is hereby corrected as shown below:

Front page, after "Primary Examiner -- Joseph M. Thesz" insert --Attorney, Agent, or Firm -- Staas & Halsey--.
Column 1, line 44, delete "operable".
Column 2, line 65, "ban" should be --band--;
          line 67, after "MHz" insert --lower--.
Column 3, line 1, after "of" insert --a--;
          line 2, "the" should be --a--;
          line 3, delete "frequency"; after "HMz" insert --frequency--.
Column 4, line 27, delete "those those";
          line 59, after "stepped" insert --in--;
          line 60, after "related" insert --to--.
Column 6, line 57, "have" should be --has--.
Column 7, line 20, after "96" insert --,--.
Column 8, line 7, after "is" insert --equal to--.
Column 10, line 2, "ones among" should be --of--.
Column 16, line 31, "a" should be --an--;
           line 32, "a" should be --the--.

Signed and Sealed this

Thirty-first Day of August 1982

[SEAL]

Attest:

GERALD J. MOSSINGHOFF

Attesting Officer     Commissioner of Patents and Trademarks